(12) United States Patent
Vera Villarroel et al.

(10) Patent No.: US 10,958,230 B2
(45) Date of Patent: Mar. 23, 2021

(54) RECONFIGURABLE OPTICAL RECEIVERS WITH EXTENDED DYNAMIC RANGE

(71) Applicant: Elenion Technologies, LLC, New York, NY (US)

(72) Inventors: Ariel Leonardo Vera Villarroel, Union City, NJ (US); Abdelrahman Ahmed, Brooklyn, NY (US); Alexander Rylyakov, Staten Island, NY (US)

(73) Assignee: Elenion Technologies, LLC, New York, NY (US)

( * ) Notice: Subject to any disclaimer, the term of this patent is extended or adjusted under 35 U.S.C. 154(b) by 256 days.

(21) Appl. No.: 16/126,732

(22) Filed: Sep. 10, 2018

(65) Prior Publication Data
US 2020/0083855 A1    Mar. 12, 2020

(51) Int. Cl.
*H03F 3/08* (2006.01)
*H03G 3/30* (2006.01)
*H03F 3/45* (2006.01)

(52) U.S. Cl.
CPC .......... *H03G 3/3084* (2013.01); *H03F 3/08* (2013.01); *H03F 3/45475* (2013.01); *H03F 2200/129* (2013.01); *H03F 2203/45116* (2013.01); *H03F 2203/45528* (2013.01); *H03G 2201/103* (2013.01)

(58) Field of Classification Search
CPC .......... H03F 1/083; H03F 1/26; H03F 1/3211; H03F 3/45076; H03F 3/45475; H03G 3/3084
USPC ........................................ 250/214 A, 214 LA
See application file for complete search history.

(56) References Cited

U.S. PATENT DOCUMENTS

2002/0005974 A1*  1/2002  Ohhata ................ H04B 10/695
                                                                         398/202

* cited by examiner

*Primary Examiner* — Kevin K Pyo
(74) *Attorney, Agent, or Firm* — Stratford Managers Corporation

(57) ABSTRACT

In optical receivers, extending the transimpedance amplifier's (TIA) dynamic range is a key to increasing the receiver's dynamic range, and therefore increase the channel capacity. Ideally, the TIA requires controllable gain, whereby the receiver can modify the characteristics of the TIA and/or the VGA to process high power incoming signals with a defined maximum distortion, and low power incoming signals with a defined maximum noise. A solution to the problem is to provide TIA's and VGA's with reconfigurable sizes, which are adjustable based on the level of power, e.g. current, generated by the photodetector.

20 Claims, 11 Drawing Sheets

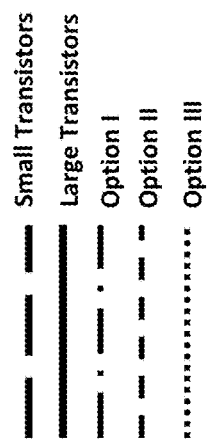
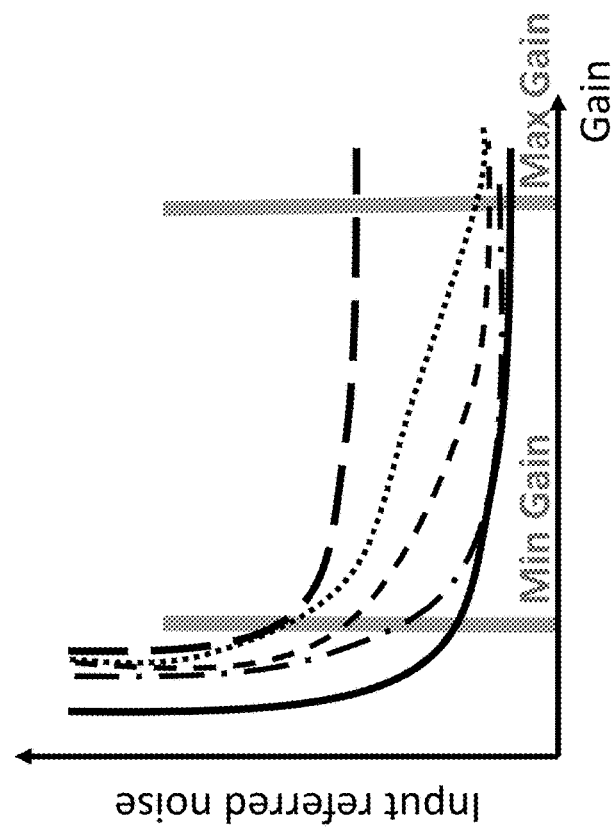
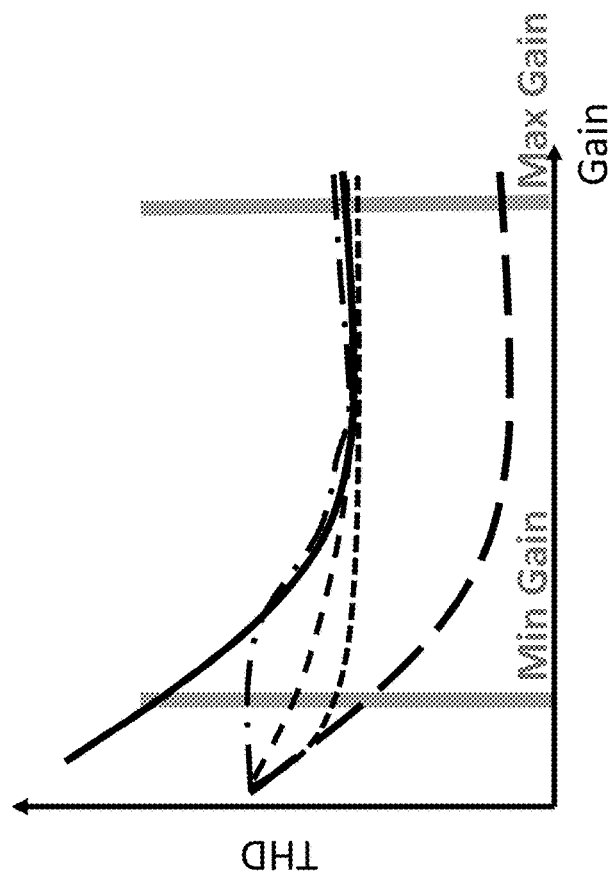
Figure 9a
Figure 9b

RECONFIGURABLE OPTICAL RECEIVERS WITH EXTENDED DYNAMIC RANGE

TECHNICAL FIELD

The present invention relates to an optical receiver, and in particular to a reconfigurable optical receiver.

BACKGROUND

Information is transmitted in an optical channel using optical modulation. In a receiver, the received optical signal contains the information, which could have been modulated in amplitude, phase, polarization or a combination thereof. The demodulation of the optical signal is done using a transducer, e.g. photodiode, that converts from the optical to the electrical domain. The transducer delivers an electrical signal, which is processed to extract the information contained in the optical signal. The maximum to minimum optical power, i.e. dynamic range, together with the transducer define the received electrical signal dynamic range. Modern communication systems use complex modulation schemes, e.g. quadrature modulation, to increase the communication channel efficiency. The efficiency of complex modulation schemes is proportional to the maximum operation frequency, i.e. baud rate, and dynamic range.

The received optical signal is transformed to an electrical signal using a transducer. Most transducers convert optical signals to electrical current. However, the current magnitude, which is proportional to the received optical power, needs to be amplified. Typically, during amplification the electrical current is converted to a voltage. The current-to-voltage amplifier, or transimpedance amplifier, remains one of the most challenging components in an optical receiver.

Large values of optical power, define high magnitude currents at the transducer output. High current at the TIA input will create distortion at the TIA output, typically due to non-linear behavior of the components used for amplification. The maximum input current a TIA can amplify, with a distortion below a defined maximum, defines the upper boundary of the TIA dynamic range.

The distortion generated in broadband signals can be quantified, by adding all the harmonics generated when a single tone signal is used at the input. The ratio of the output signal power, at the input signal tone frequency, to the total added power of the harmonics in the output signal is the total harmonic distortion, or THD.

On the other hand, small values of optical power, define small magnitude currents at the transducer output. However, small currents at the TIA input will be more sensitive to noise added by the TIA during amplification. The lower boundary of the TIA dynamic range is defined by the minimum input current that can be amplified, while still enabling the information to be recovered, even with the added TIA noise.

A variable gain TIA requires gain control, whereby the receiver can modify its characteristics to process high power incoming signals with a defined maximum distortion, and low power incoming signals with a defined maximum noise. Extending the TIA dynamic range is a key to increasing the receiver's dynamic range, and therefore increase the channel capacity.

An object of the present invention is to overcome the shortcomings of the prior art by providing a receiver including a TIA with variable gain for maximum input signal dynamic range, whereby the gain may be reduced for large input current signals, while adding the minimum amount of distortion, and whereby the gain may be increased for small input current signals, while adding the minimum amount of noise

SUMMARY OF THE INVENTION

Accordingly, the present invention relates to an optical receiver comprising:
a photodetector capable of generating an input current in response to an optical signal;
a trans-impedance amplifier (TIA) capable of converting the current into a voltage; and
a variable gain amplifier (VGA) capable of amplifying the voltage to a desired output voltage;
wherein the TIA includes a first feedback loop including:
a first input for receiving the current from the photodetector;
first and second transistors, each with first and second terminals, each first terminal connected in parallel and to the first input, and each second terminal connected in parallel and to a first output; and
a first feedback resistor between the first terminals and the second terminals;
wherein the second transistor is reconfigurable between on and off positions independent of the first transistor.

Another aspect of the present invention relates to an optical receiver comprising:
a photodetector capable of generating a current in response to an optical signal;
a trans-impedance amplifier (TIA) capable of converting the current into a voltage; and
a variable gain amplifier (VGA) capable of amplifying the voltage to a desired output voltage;
wherein the VGA includes first and second transistor sets including input terminals and output terminals in parallel; and
wherein the second transistor set is reconfigurable between on and off positions independent of the first transistor set for adjusting overall base resistance and base-collector capacitance.

BRIEF DESCRIPTION OF THE DRAWINGS

The invention will be described in greater detail with reference to the accompanying drawings which represent preferred embodiments thereof, wherein:

FIG. 9a is a plot of Noise vs Gain for a plurality of differently calibrated TIAs and VGAs;

FIG. 9b is a plot of THD vs Gain for a plurality of differently calibrated TIAs and VGAs;

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
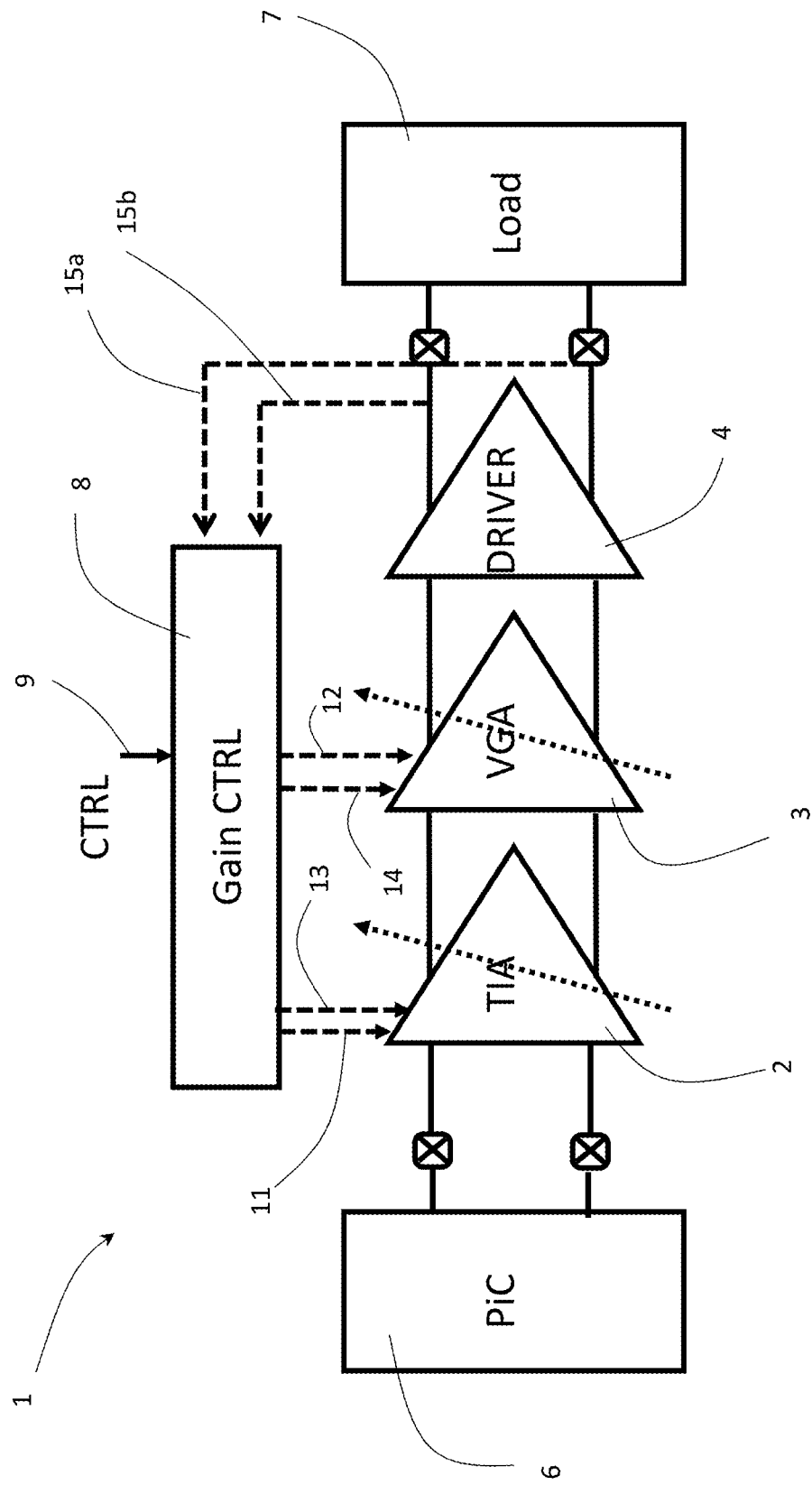
FIG. 1 is a schematic diagram of an optical receiver in accordance with an embodiment of the present invention.

With reference to FIG. 1, a receiver 1 includes a variable gain trans-impedance amplifier (TIA) 2 for converting a photodiode current signal into a voltage signal, a variable gain amplifier (VGA) 3 for amplifying the voltage signal, and a driver stage 4 for driving subsequent stages, e.g. ADC. The front end of the receiver 1 may be connected to a general transducer, which may be contained in a photonic integrated circuit (PIC) 6 including one or more transducers, such as one or more photodetectors, and preferably a pair of photodiodes. The back end of the receiver 1 may be connected to an output load, e.g. a digital signal processor 7 for converting the output of the receiver 1 into digital signals.

The receiver 1 includes a Gain Control Circuit (GCC) 8 to set the gain of the TIA 2 and the VGA 3, via TIA and VGA gain control signals 11, 13 and 12, 14, respectively, for a given range of input signal power and desired range of output signal power. The gain control circuit 8 is typically implemented as an open loop control or a close loop control. An open loop implementation sets the gain of the TIA 2 and the VGA 3 according to an overall gain control signal 9 from a device controller (not shown). A closed loop control senses the output signal power from the driver stage 4, via feedback signals 15a and 15b to a power, e.g. voltage, detector in the gain control circuit 8, and varies the gain of the TIA 2 and the VGA 3 to set the desired output voltage magnitude. The closed loop mode is also known as automatic gain control (AGC). The performance of the receiver 1 is determined by the individual block's performances and the gain control scheme.

The proposed solution description is based in a SiGe Bipolar technology, however, the reconfigurable principle presented herein may be applied to CMOS or other technologies A dominant source of noise in the TIAs 2 and the VGAs 3 is the transistor base resistor (rb). To obtain low noise values, the resistance of the base resistor rb should be reduced. One way of reducing the resistance of the base resistor rb is by increasing the transistor's size.

A dominant source of distortion in the TIAs 2 and VGAs 3 is the non-linear capacitance (Cbc) formed in the base-collector of a transistor. The base collector capacitance Cbc varies according to the base-collector voltage. Large voltage signals, generated between the base-collector terminals during operation of the TIA 2 or VGA 3, vary the value of the base collector capacitance Cbc. Because the base collector capacitance Cbc is part of the transfer function, the latter becomes non-linear with respect to voltage signals, which translates to the creation of (undesired) frequency components in the output signal, i.e. distortion.

Optimization for low voltage signals require a low noise contribution from the TIA 2 and the VGA 3. Consequently, large area transistors may be used to minimize the resistance of the base resistor rb. However, when a design optimized for low noise, i.e. large area transistors operating with large input signals, it suffers from high distortion due to the (increased) Cbc in the large area transistors.

Optimization for high voltage signals requires a low distortion contribution from the TIA 2 and VGA 3. The optimization will require small area transistors to minimize the capacitance of the base-collector capacitor Cbc. However, operation of the low-distortion optimized design will suffer from high noise due to (increased) base resistance (rb) in small area transistors.

The present solution enables the TIA 2 and the VGA 3 to be reconfigurable according to the input signal magnitude to offer low noise for small input (current) signals and low distortion for large input (current) signals, effectively increasing the dynamic range of the receiver 1.

Figure 2:
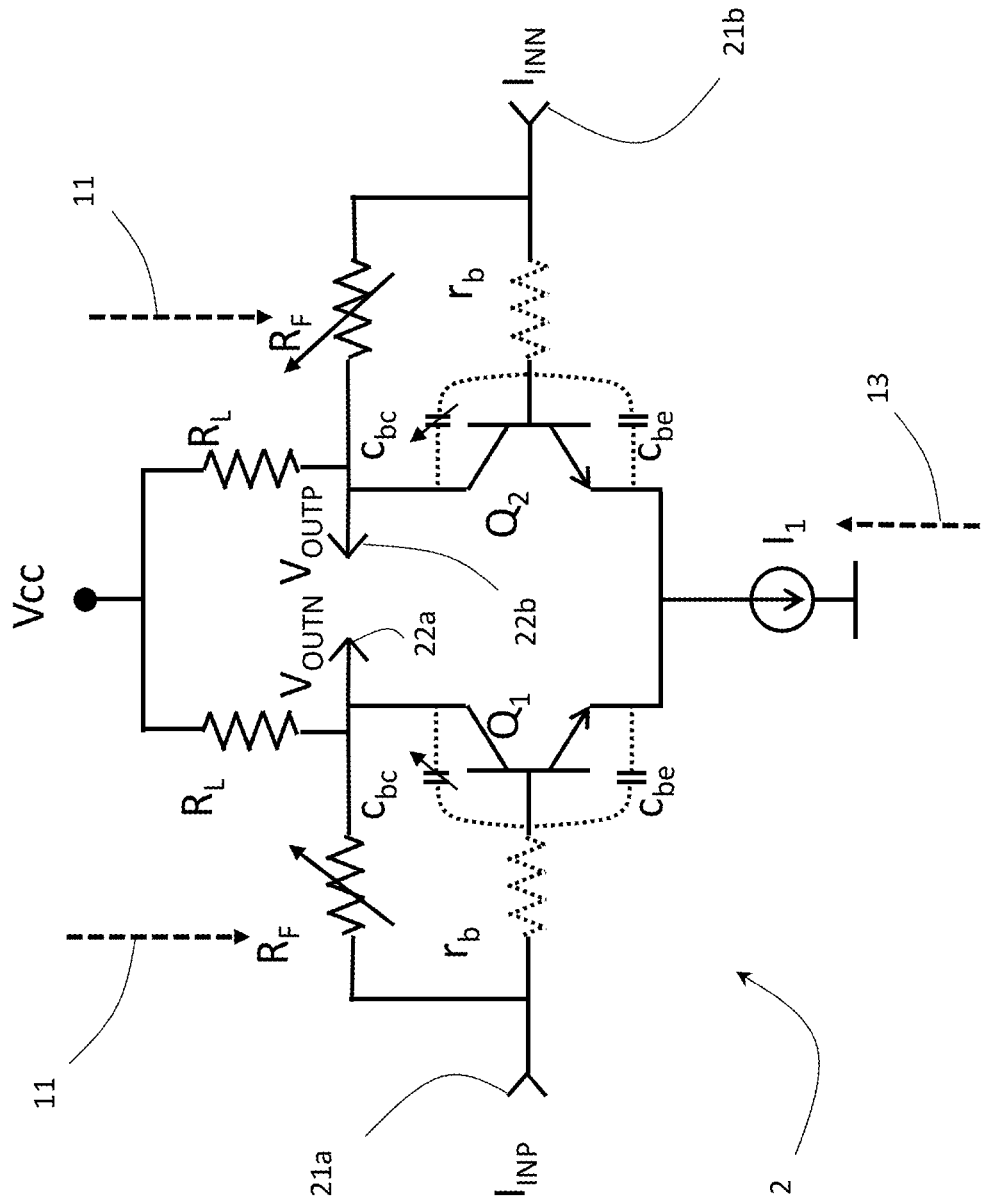
FIG. 2 is a schematic diagram of a trans-impedance amplifier (TIA) of the optical receiver of FIG. 1.

With reference to FIG. 2, a simplified TIA 2 may include differential inputs 21a and 21b for currents IINP and IINN, respectively, from the front end 6, and differential outputs 22a and 22b, for voltages VOUTP and VOUTN, for transmission to the VGA 3. Although this example shows a differential-input differential-output design with each of the first and second transistor components including a differential transistor pair Q1 and Q2, an optical receiver with a single linear input and output, with each of the first and second transistor components comprising a single transistor Q1 is also within the scope of this invention.

In a first transistor component, the differential pair Q1 and Q2 include parasitic components, e.g. the transistor base resistance rb, the (non-linear) base-collector capacitance Cbc, and the base-emitter capacitance Cbe as illustrated. Noise originating in the TIA 2 is proportional to the resistance of the base resistance rb. The output voltage (Vout) modulates the capacitance of the non-linear base-collector capacitance (Cbc).

A variable feedback resistor (RF), controlled by the TIA gain control signal 11 from the GCC 8, may be used to set the gain of the TIA 2 (gain~RF when the transconductance gm of the TIA 2×the load resistor RL is large, i.e. gm×RL>>1). Typically, the variable feedback resistor RF is positioned in a feedback loop between the gate or base of each transistor Q1 and Q2 and one of the other two terminals, e.g. drain or collector. A DC supply voltage VCC and a first DC current source I1 along with load resistor RL may be used for biasing the first transistor component, e.g. differential pair Q1 and Q2, under control of the GCC 8 via TIA bias signal 13. The input currents IINP and INN may then be transformed to output voltages VOUTP VOUTN.

Figure 3:
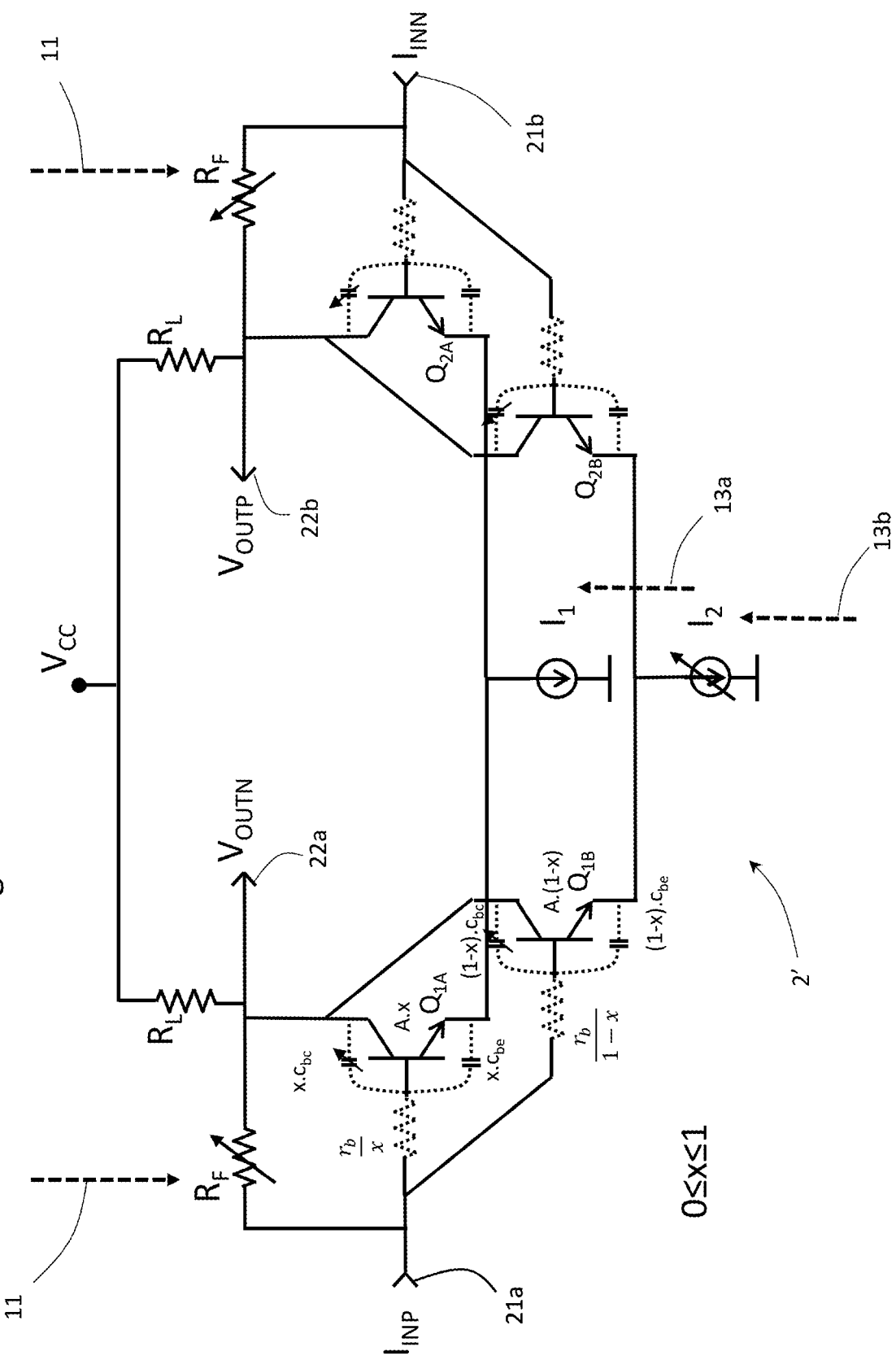
FIG. 3 is a schematic diagram of a trans-impedance amplifier (TIA) with multiple transistor sets of the optical receiver of FIG. 1.

With reference to FIG. 3, to reduce noise from a TIA 2', including similar elements to the TIA 2, a larger area input device, e.g. transistor pair Q1 and Q2, providing a base resistor rb with a lower base resistance, may be used. To make the input device reconfigurable, i.e. the size of the base resistance adjustable, the single larger area transistor circuit device, e.g. single transistor Q1 or differential pair Q1 and Q2, may be replaced by parallel and switchable transistors Q1A and Q1B or differential pairs Q1A-Q2A and Q1B-Q2B. Accordingly, each of the transistors, e.g. Q1 or Q2, is replaced by a plurality of transistors, each comprising a plurality of transistor devices, e.g. Q1A-Q1N and Q2A-Q2N, respectively, with inputs and outputs connected in parallel, and with a third independent terminal for independent biasing, whereby one or more transistors, e.g. Q1A-Q1N and Q2A-Q2N may be made controllable by the GCC 8. In the illustrated embodiment of FIG. 3, at least one of the first current source I1 or a second DC current source I2, may be controllable, e.g. actuatable between an on position and an off position by first and second TIA bias signals 13a and 13b, respectively, to include or exclude the second transistor component, e.g. single transistor Q1B or pair of transistors Q1B and Q2B, from the circuit independent of the first transistor Q1A or first transistor pair Q1A and Q2A. Other means for controlling the second transistor component, e.g. transistor pairs Q1B and Q2B, are also possible, including controlling individual gate voltages or the amount of input current IINP and IINN is transmitted to each transistor Q1A or Q1B, etc. The total resistance of the two parallel transistors Q1A and Q1B is rb=rb1A∥rb1B, whereby the resistance of the first transistor of the first pair Q1A is rb1A=rb/x, and the resistance of the first transistor from the second pair Q1B is rb1B=rb/(1−x), where 0≤x≤1. Similarly, when the total capacitance is Cbc=Cbc1A+Cbc1B, the base-collector capacitance of the first transistor from the first pair Q1A is Cbc1A=xCbc, and the capacitance of the first transistor from the second pair Q1B is Cbc1B=(1−x)Cbc, where 0≤x≤1. Similarly, when the total gain is A, the gain of the first transistor from the first pair Q1A is xA, and the gain of the first transistor from the second pair Q1B is (1−x)A, where 0≤x≤1.

The power detector in the GCC 8 may determine whether the power or level of the input signal falls with a predetermined portion, e.g. lower, middle or upper portions, of the dynamic range of the receiver 1 or the TIA 2. For example: when low magnitude input currents, e.g. in the lower half, third or quarter of the receiver's or TIA's dynamic range, are generated in the front end 6, large amplification by the TIA 2' is required with minimum added noise, whereby the second current source I2 is turned on by the second TIA bias signal 13b to ensure both transistor components, e.g. Q1A/Q2A and Q1B/Q2B, are activated providing a larger transistor base area and reducing the resistance to rb when compared to rb/x and rb/(1−x), which are larger than rb when 0<x<1.

Although this example shows a differential-input differential-output design with each of the first and second transistor components including a differential transistor pair Q1A/Q2A and Q1B/Q2B, an optical receiver with a single linear input and output, with each of the first and second transistor components comprising a single transistor Q1A and Q1B, respectively, is also within the scope of this invention.

Figure 4:
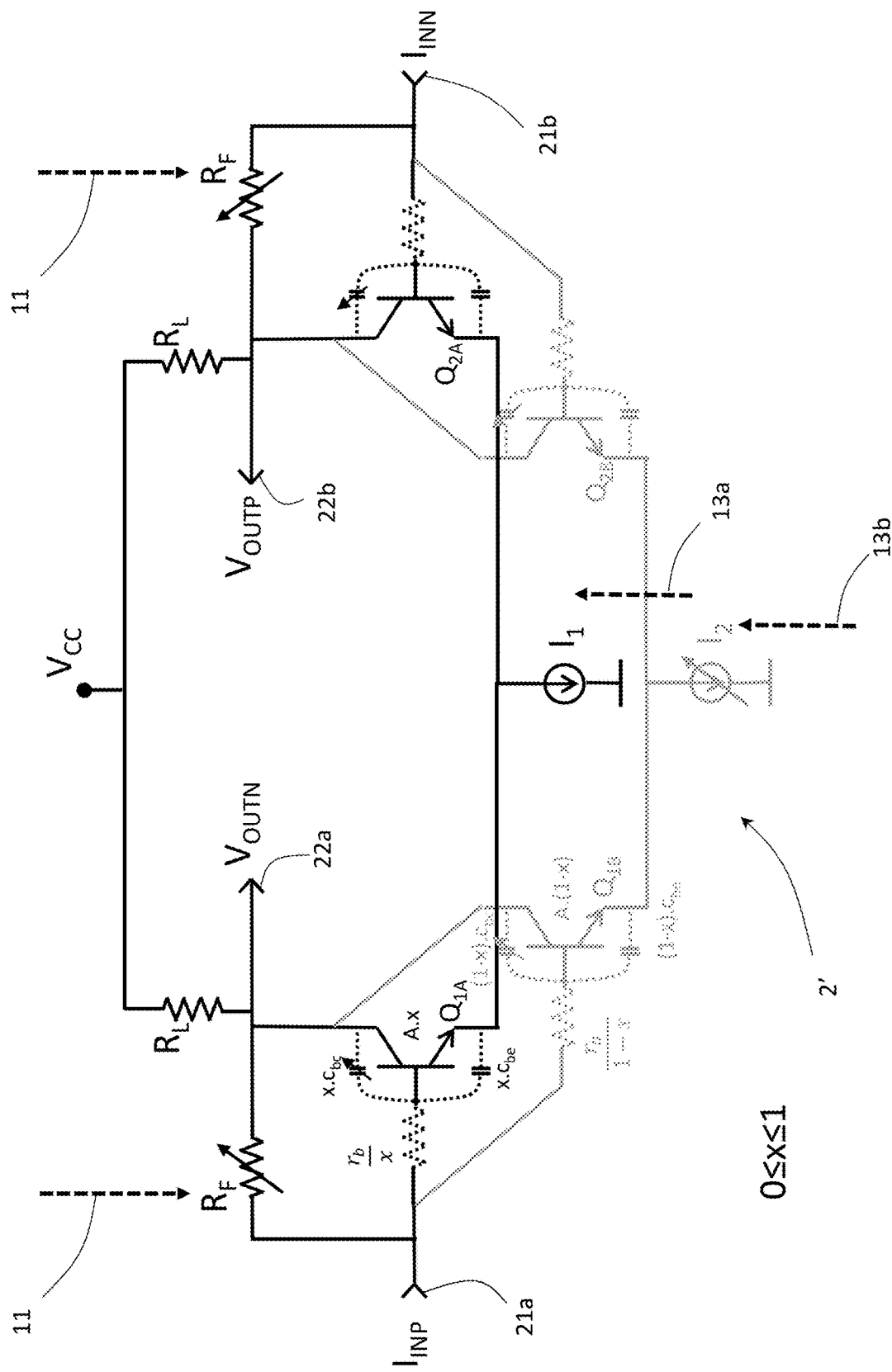
FIG. 4 is a schematic diagram of the trans-impedance amplifier (TIA) of FIG. 3 with a set of transistors turned off.

With Reference to FIG. 4, when high magnitude input currents IINP and IINN are generated in the front end 6, e.g. in the upper half, third or quarter of the receiver's or TIA's dynamic range, less amplification by the TIA 2' is required, whereby the second current source I2 may be turned off by the second bias signal 13b excluding the second transistor component, e.g. Q1B and Q2B, which reduces the (excessive) gain, and (undesired) base-collector variable capacitance Cbc by (1−x)Cbc. Consequently reducing non-linearities in the output voltage VOUT.

Figure 5:
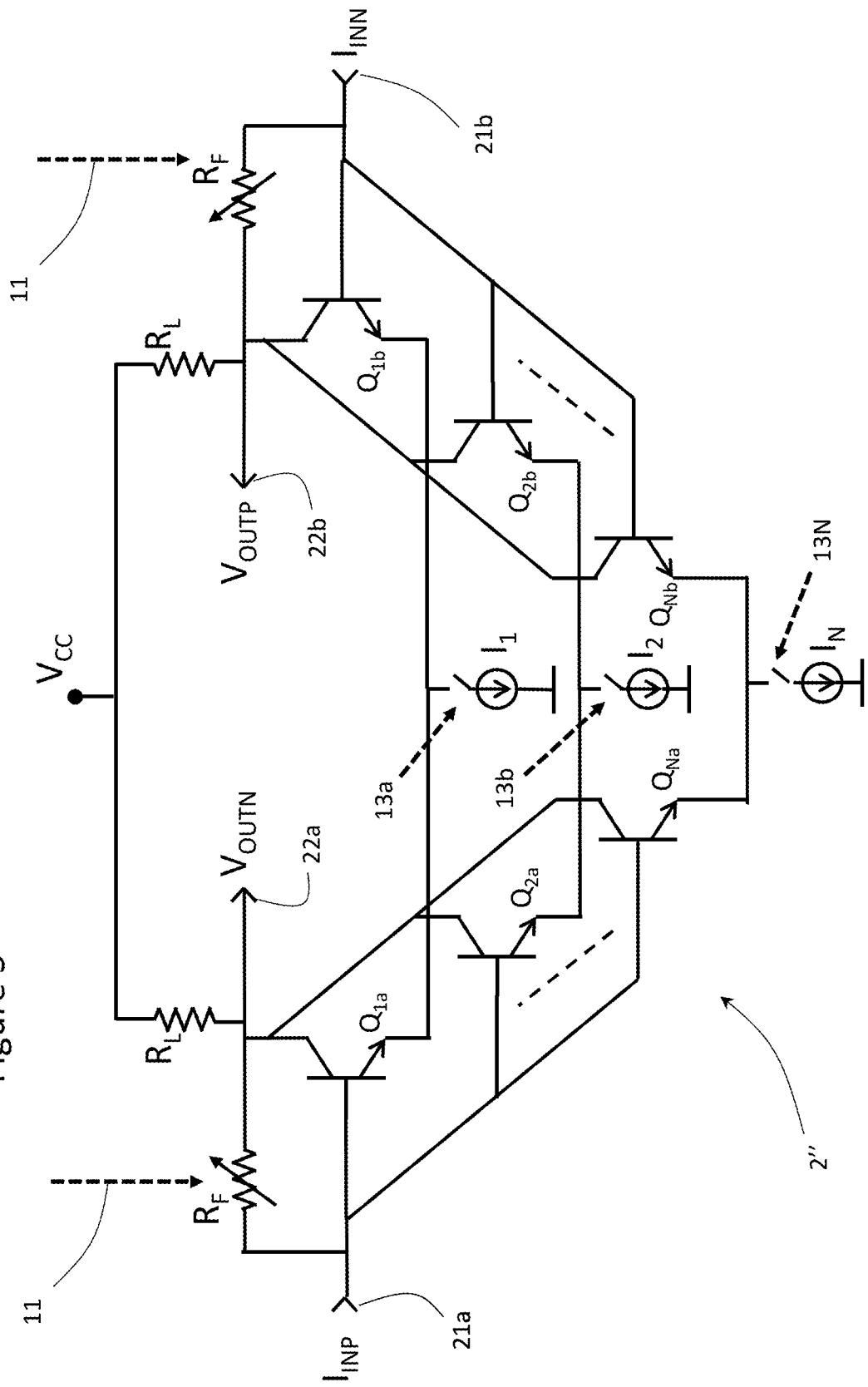
FIG. 5 is a schematic diagram of a trans-impedance amplifier (TIA) of the optical receiver of FIG. 1 with multiple transistor sets.

The reconfigurable TIA 2" may also be controlled using a digital control. FIG. 5 illustrates an implementation in which a plurality of transistor components, e.g. Q1a-QNa are biased by a plurality of current sources I1, I2, . . . , IN, which may be digitally controlled themselves or with switches, in between each current source, I1, I2 . . . , and each transistor component, to turn ON/OFF selected transistor component, e.g. differential pairs of transistors Q1a, 1b, Q2a,2b, . . . , QNa,Nb, respectively. Each of the transistors, e.g. Q1a, Q2a, . . . , QNa, may have a same or a different size or area (length×width), whereby different combinations and permutations of the transistors Q1a, Q2a, . . . QNa may be activated to provide a greater control over the resulting total resistance depending on how large the input current, e.g. in the lower, middle or upper part of the dynamic range of the receiver 1 or the TIA 2.

Figure 6:
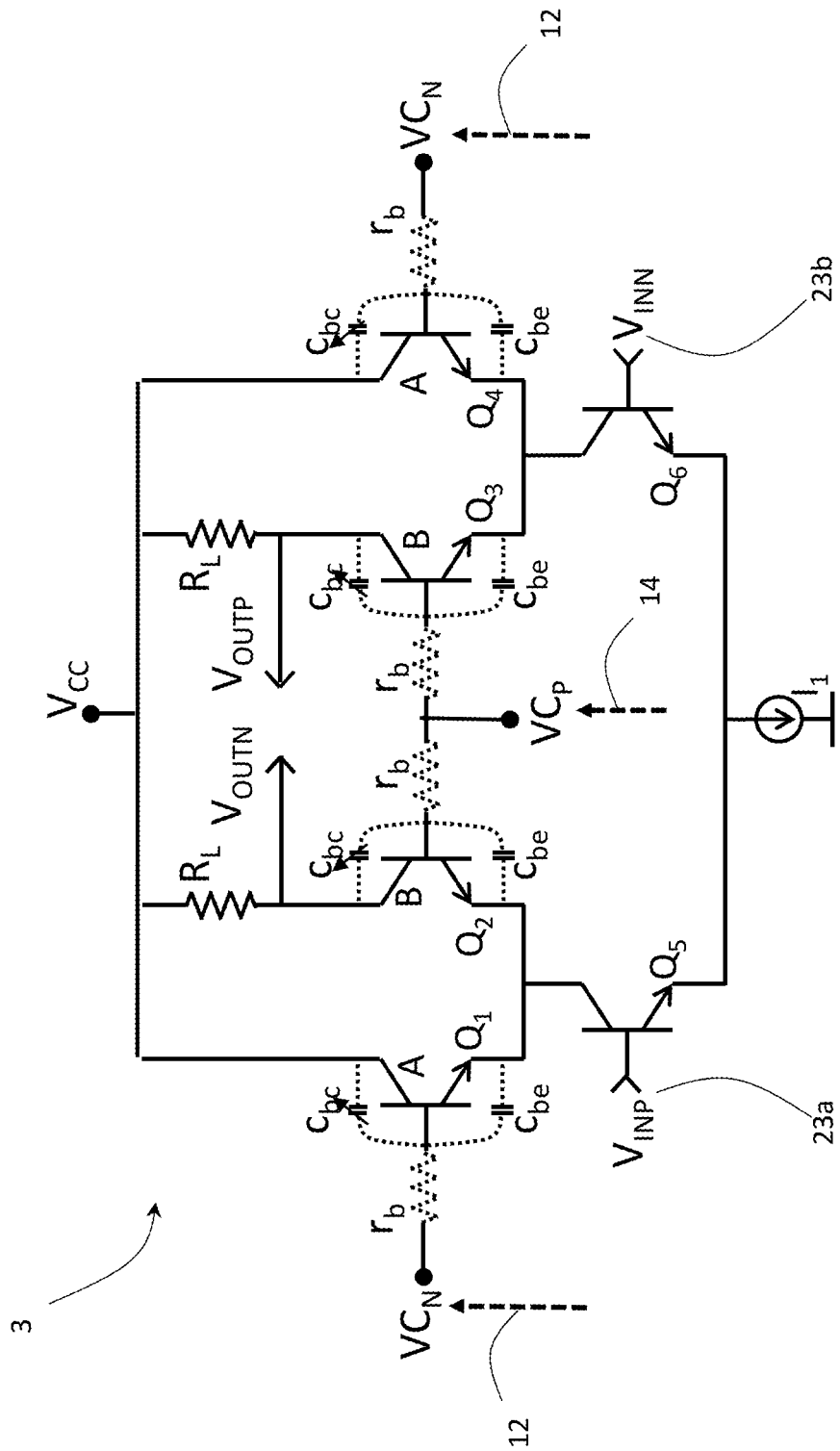
FIG. 6 is a schematic diagram of a variable gain amplifier (VGA) of the optical receiver of FIG. 1.

With reference to FIG. 6, the VGA 3 may connected after the TIA 2 with the VOUTP and VOUTN output terminals 22a and 22b of the TIA 2 connected to VINP VINN input terminals 23a and 23b of the VGA 3. The VGA voltage VCP-VCN sets the voltage gain of the VGA 3. The voltages VCP-VCN are set by the gain control circuit 8 via VGA control signal 12 and 14. The VGA 3 operates at high gain settings for low voltage input signals VINP and VINN, and low gain settings for high voltage input signals VINP and VINN. Low voltage input signals VINP and VINN are more sensitive to noise; therefore, the VGA 3 should have minimum noise at high gain settings. High voltage input signals VINP and VINN may produce distortion; therefore, the VGA 3 should have low distortion at low gain settings. For the VGA 3, gain variation may be achieved by controlling the DC voltage difference between VCP and VCN. Similar VGA topologies using a quadrature multiplier may also be used. A DC supply voltage VCC and a first DC current source I1 may be used for biasing the differential pair Q5 and Q6. The current source I1 may be designed and provided with a predetermined value in accordance with the requirements and structure of the VGA.

Transistors Q1 to Q4 have parasitic components, e.g. a transistor base resistance rb, base-emitter capacitance Cbe, and a (non-linear) base collector capacitance Cbc, as shown. FIG. 6 illustrates the differential input voltage, differential output voltage variable-gain amplifier 3 with differential pair Q5 and Q6, but a VGA with a single-ended input and single-ended output, is also within the scope of this invention.

Figure 7:
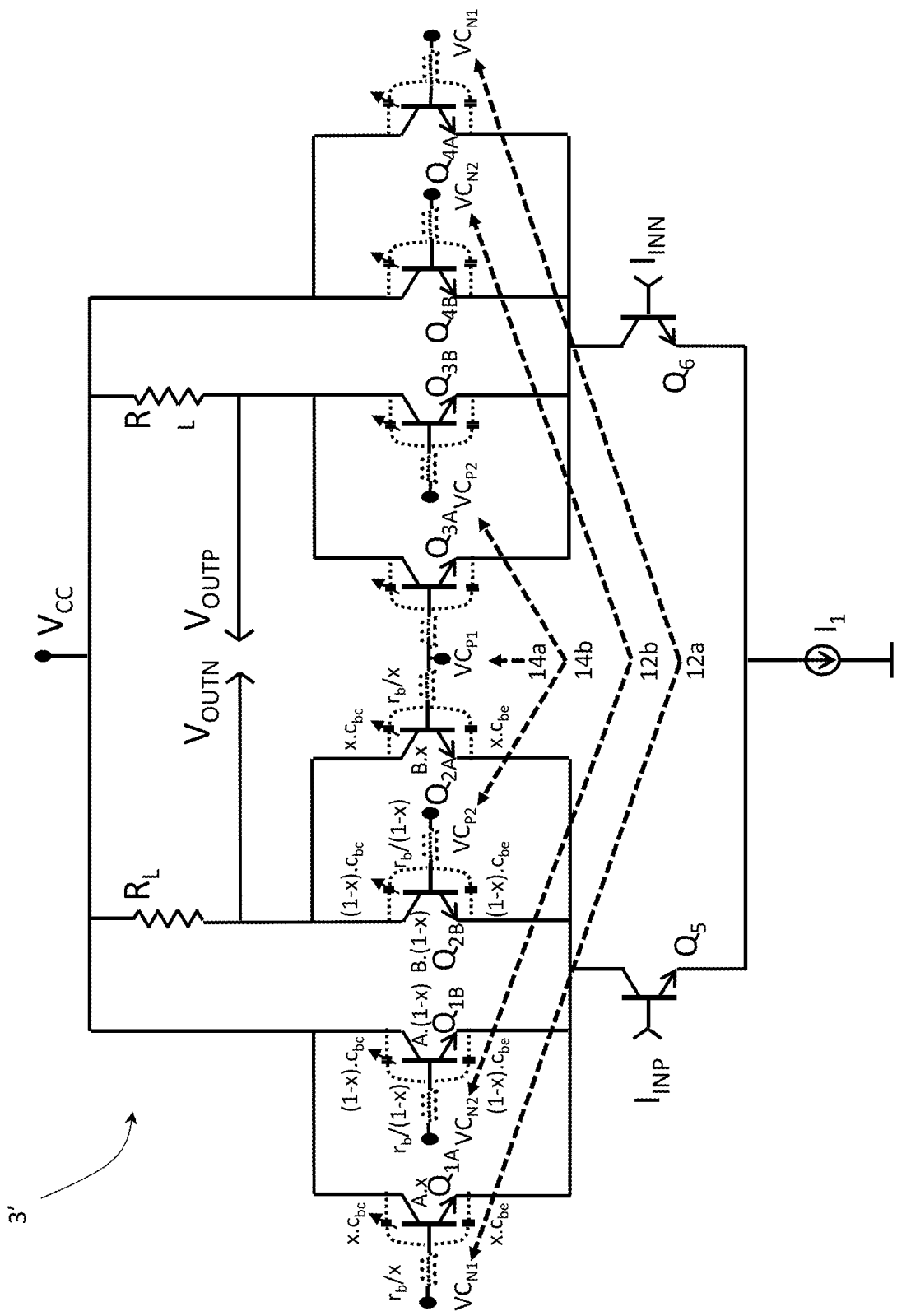
FIG. 7 is a schematic diagram of a variable gain amplifier (VGA) of the optical receiver of FIG. 1 with multiple transistor sets.
Figure 8:
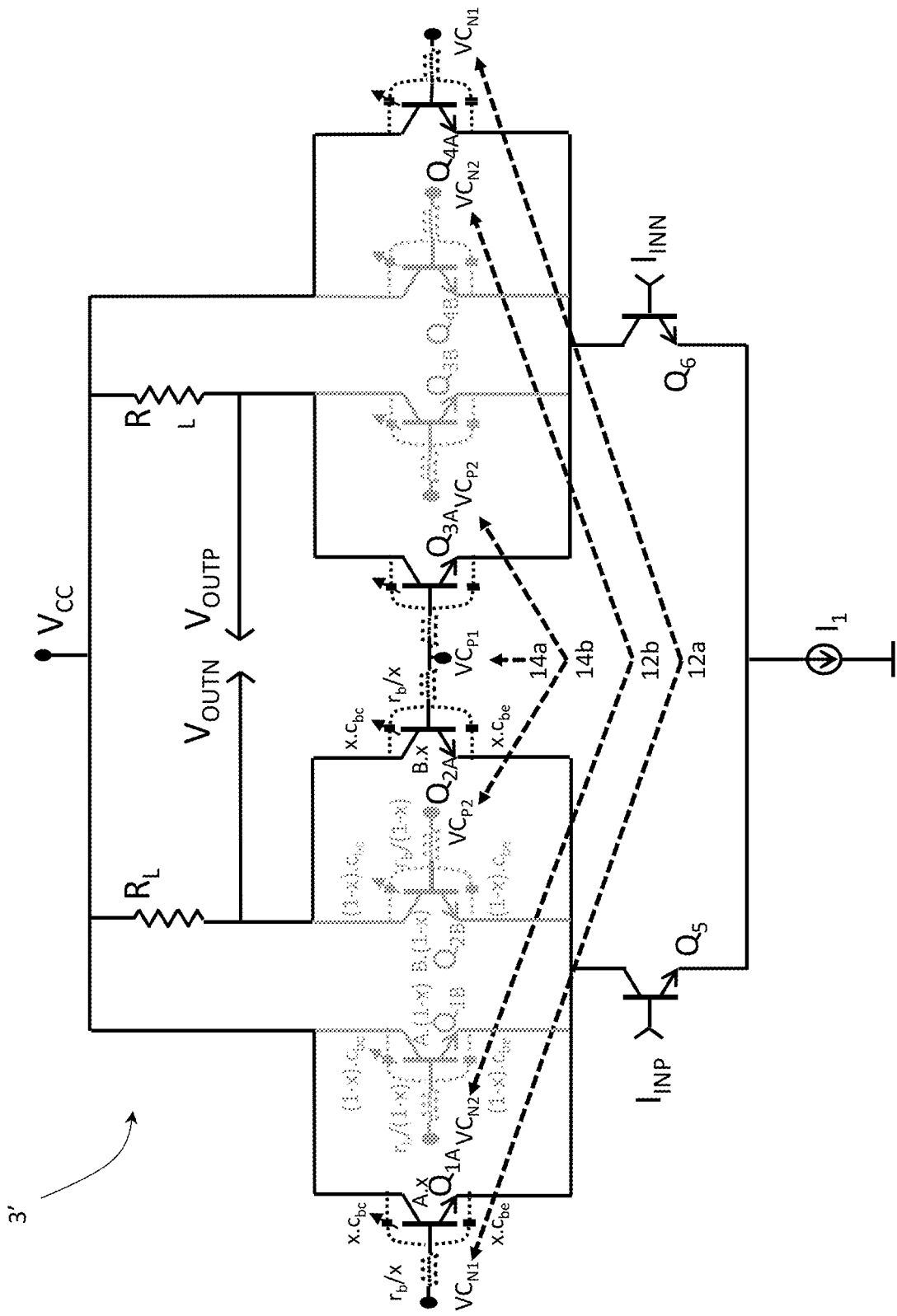
FIG. 8 is a schematic diagram of the variable gain amplifier (VGA) of FIG. 7 with a set of transistors turned off.

Noise originating in the VGA 3 is proportional to the base resistance rb of the transistors Q1 to Q4. While distortion originated in VGA 3 is proportional to the nonlinear base-collector capacitance CBC. To reduce noise in the VGA 3, larger transistor devices, i.e. with reduced base resistance, may be used. With reference to FIGS. 7 and 8, each of the large area devices Q1 to Q4 may be replaced by a plurality of transistor devices, e.g. transistors Q1A/Q1B, Q2A/Q2B, Q3A/Q3B and Q4A/Q4B, forming a plurality of differential pairs, e.g. Q1A/Q2A, Q1B/Q2B, Q3A/Q4A and Q3B/Q4B, with inputs and outputs connected in parallel and with each transistor or transistor pair including a third independent terminal for independent biasing control.

DC current voltage (VCP1+VCN1)/2 set the common-mode voltage and (VCP2−VCN2)/2 may be used to turn ON/OFF first and second sets of transistors, e.g. by turning off the base voltages VCP2 and VCN2 to the second transistor pairs Q1B/Q2B and Q3B,Q4B with second reconfigurable control signals 12b and 14b, while activating base voltages VCP1 and VCN1 for the first transistor pairs Q1A/Q2A and Q3A,Q4A with first reconfigurable control signals 12a and 14a. For example, as in FIG. 8, since large input currents require less amplification, the common mode of VCP2, VCN2 may be reduced by the second reconfigurable control signals 12b and 14b to turn off the second set of transistors Q1B, Q2B, Q3B, Q4B, reducing the effective base-collector capacitance Cbc by (1−x)Cbc and improving linearity in the VGA stage 3. The total resistance of the two transistors Q1A and Q1B is rb, whereby the resistance of the first transistor of the first set Q1A is rb/x, and the resistance of the first transistor from the second set Q1B is rb/(1−x), where $0 \leq x \leq 1$. Similarly, when the total capacitance is Cbc, the base-collector capacitance of the first transistor from the first set Q1A is xCbc, and the capacitance of the first transistor from the second set Q1B is (1−x)Cbc, where $0 \leq x \leq 1$.

Control of the reconfiguration between optimum noise and optimum total harmonic distortion (THD) is implemented in the control circuit 8. The control may be static or dynamic depending on the system requirements. For static gain control with reference to FIG. 1, the input signal CTRL 9 is mapped to a specific gain setting for the TIA 2 and the VGA 3. Therefore different mappings between the CTRL signal 9 and the TIA and VGA gain control signals 11, 12, 13 and 14 may be defined to control the overall gain, which allows a trade-off between optimum noise and optimum linearity. For automatic gain control (refer to FIG. 1), feedback signals 15a and 15b are transmitted to the GCC 8, which includes a power detector to determine the output power level, e.g. voltage, of the signals output from the Driver 4. The GCC 8 then delivers control signals 11, 12, 13 and 14 that are used to set the gains of the TIA 2 and the VGA 3 based on the overall gain control signal 9. The gains in the TIA 2 and/or the VGA 3 are modified automatically until the output of the power detector matches the external signal.

With reference to FIGS. 9a and 9b, an optimized design for low noise (solid line) suffers from higher THD, while a lower THD (large dashed) suffers from higher noise. Reconfiguration of the receiver 1, i.e. the TIA 2 and the VGA 3, with different values for x may be implemented with different responses (Options I, II and III) according to the design requirements to get minimum noise at Max Gain settings and minimum THD at Min Gain settings. Option I, II and III are optimized for low noise at maximum gain (needed for low power input signals, which are more sensitive to noise), and low distortion at minimum gain (needed for high power signals, which are more sensitive to distortion).

Dynamic range is limited by the acceptable noise and distortion. Accordingly, a signal with "low", power, current or voltage will require large amplification. The receiver (TIA+VGA+DRIVER) will add noise when amplifying, therefore, a "low" signal is in the lower portion of the device's dynamic range, in which the signal can be amplified with noise added, whereby the information can still be recovered from the original signal. A "high" signal, on the other hand, requires less amplification. The receiver will add distortion when amplifying, then a high signal is in the upper portion of the device's dynamic range, in which the signal can be amplified and distortion added, whereby the information can still be recovered from the original signal.

The difference between Options I, II and III is observed in gain settings between min and max gain. Option I is optimized for lower noise (worst distortion) when compared to Option III, optimized for lower distortion (worst noise). Option II is a middle point of improvement. As an example: for Options I x=0.7, II x=0.5 and III x=0.3, at middle gain setting, a partition of areas will be 70-30%, 50-50% and 30-70%, respectively, i.e. for Option I the mid gain settings has the transistors comprising 70% of the total area ON, and 30% of the total area OFF, therefore, lower noise compared to option III, which has only the transistors comprising 30% of the total area ON, i.e. corresponding to larger resistance, hence, larger noise. In other words, for a two transistor system, for option II, both the transistors Q1A and Q1B have the same area, whereas in option I and II, one of the transistors Q1A or Q1B may comprise at least twice as large an area than the other, e.g. 2-4 times the area.

Figure 10:
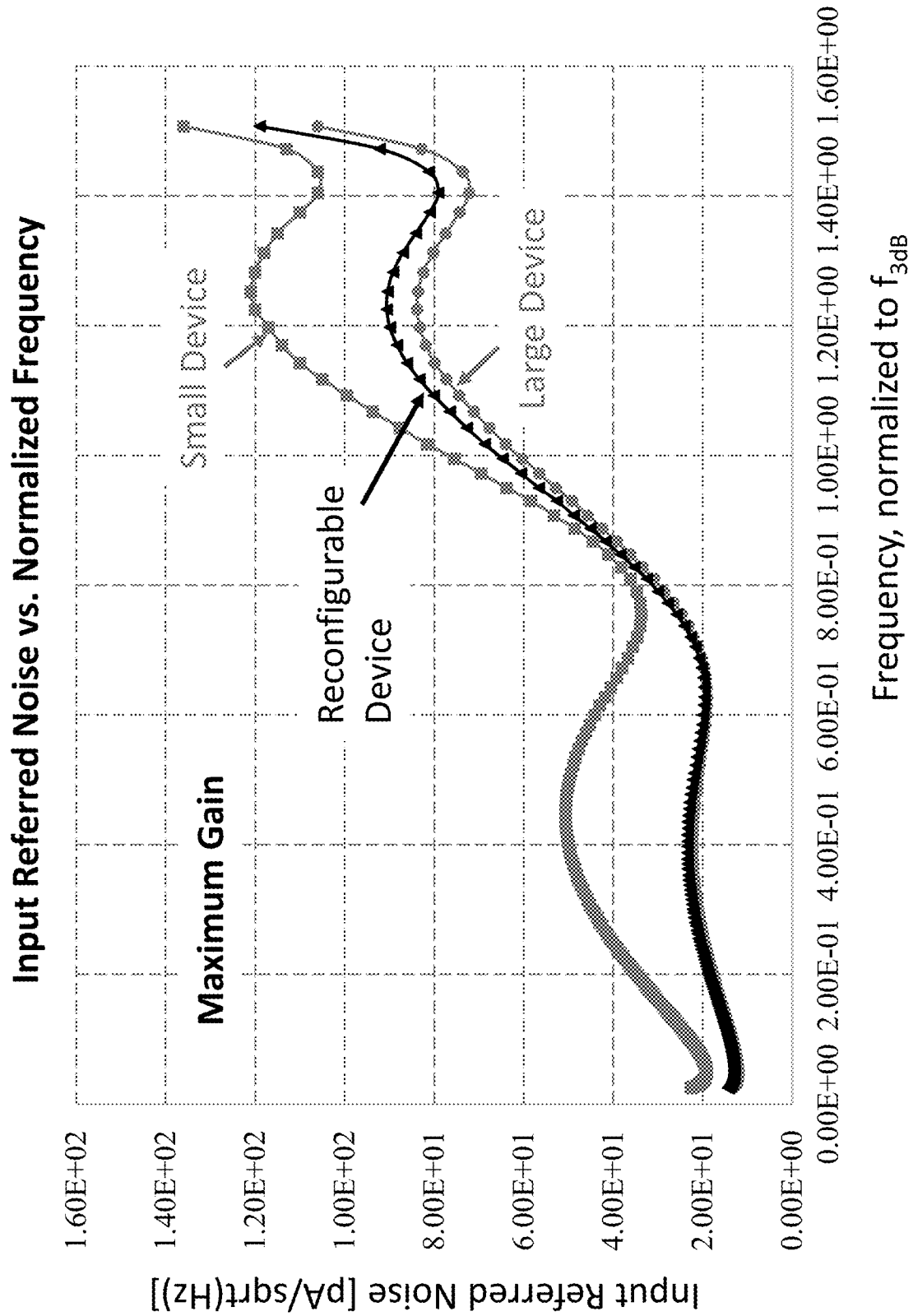
FIG. 10 is a plot of Input Referred Noise vs Normalized Frequency for a plurality of differently calibrated TIAs.
Figure 11:
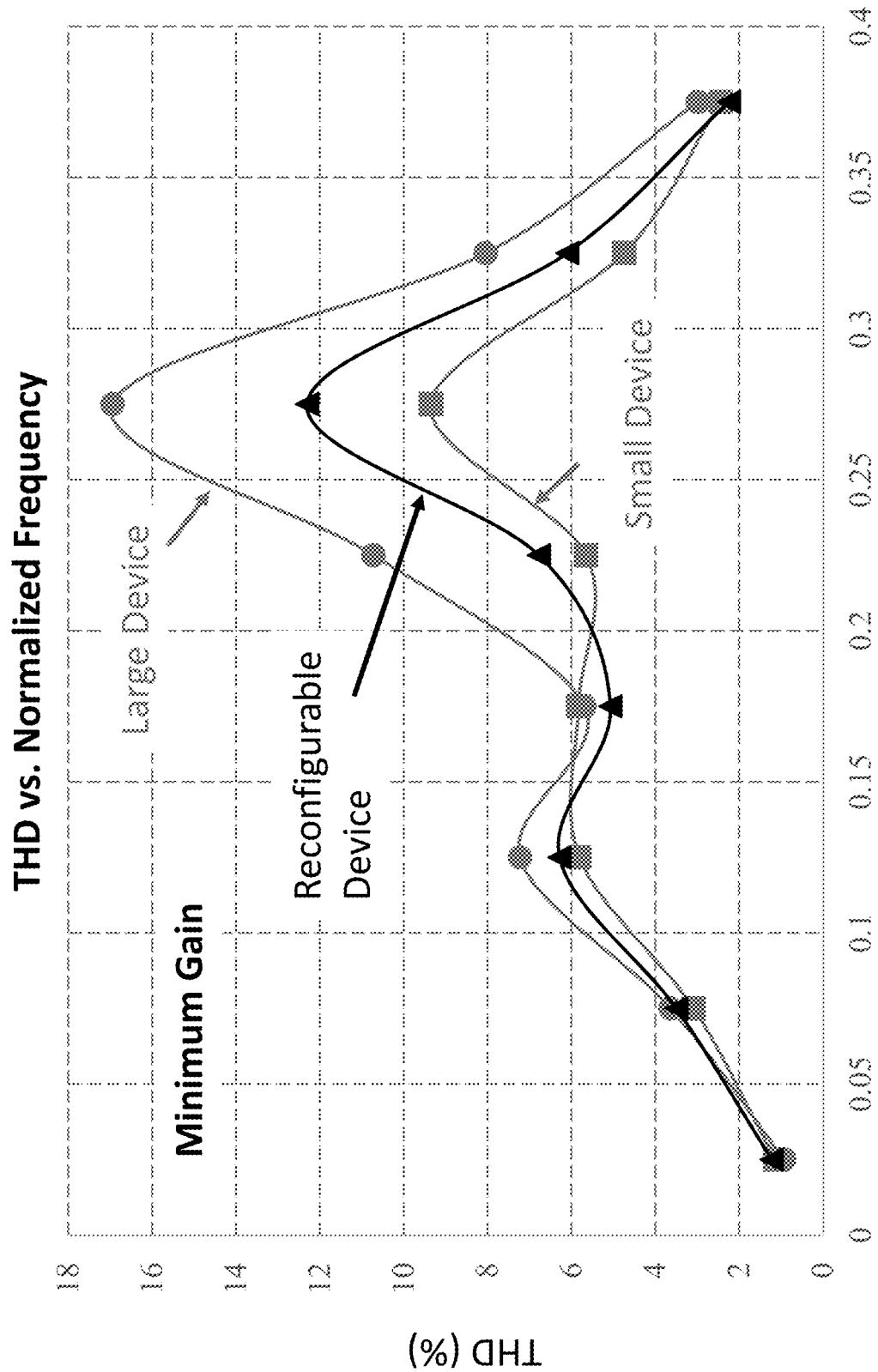
FIG. 11 is a plot of THD vs Normalized Frequency for a plurality of differently calibrated TIAs.

With reference to FIG. 10, the curve for reconfigurable device, in accordance with the present invention, generates noise almost as low as a single large area device, compared to a smaller area device for a wide range of frequencies. Furthermore, with reference to FIG. 11, the curve of the reconfigurable device, in accordance with the present invention, generates THD almost as low as a single small area device, compared to a single large area device for a wide range of frequencies.

The present invention enabling transistors, including parallel input and output terminals, which may be turned ON and OFF depending upon the requirements of a device utilizing a third independent terminal, is particularly applicable for TIA's and VGA's, but may be used with other electrical components, as well.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical receiver comprising:
    a photodetector capable of generating an input current in response to an optical signal;
    a trans-impedance amplifier (TIA) capable of converting the current into a voltage; and
    a variable gain amplifier (VGA) capable of amplifying the voltage to a desired output voltage;
    wherein the TIA includes a first feedback loop including:
        a first input for receiving the current from the photodetector;
        first and second transistors, each with first and second terminals, the first terminals connected in parallel and to the first input, and the second terminals connected in parallel and to a first output; and
        a first feedback resistor between the first terminals and the second terminals;
        wherein the second transistor is reconfigurable between an on position and an off position independent of the first transistor.

2. The optical receiver according to claim 1, further comprising:
    a gain control circuit for transmitting a control signal to the second transistor for reconfiguring the second transistor between the on position and the off position based on a magnitude of the input current.

3. The optical receiver according to claim 2, further comprising:
    first and second biasing components for biasing the first and second transistors, respectively;
    wherein each of the first and second transistors comprises a third terminal connected to one of the first and second biasing components; and
    wherein the control signal from the gain control circuit comprises a bias signal to the second transistor for reconfiguring the second transistor between the on position and the off position.

4. The optical receiver according to claim 3, wherein the second biasing component includes a switch;

wherein the gain control circuit is capable of controlling the switch with the bias signal for reconfiguring the second transistor component between the on and off positions.

5. The optical receiver according to claim 1, wherein each of the first and second transistors comprise different sizes.

6. The optical receiver according to claim 1, further comprising a gain control circuit capable of transmitting a TIA gain control signal to the TIA for adjusting gain.

7. The optical receiver according to claim 6, wherein the first feedback resistor comprises a variable feedback resistor controllable by the first gain control signal for adjusting the gain.

8. The optical receiver according to claim 6, wherein the gain control circuit is also capable of transmitting a VGA gain control signal to the VGA for adjusting the gain.

9. The optical receiver according to claim 1, further comprising a gain control circuit capable of transmitting a VGA gain control signal to the VGA for adjusting gain.

10. The optical receiver according to claim 9, wherein the VGA includes first and second transistor sets, each of the first and second transistor sets including input terminals and output terminals connected in parallel, and a third independent terminal for independent bias control; and wherein the second transistor set is reconfigurable between on and off positions for adjusting overall base resistance and overall base-collector capacitance.

11. The optical receiver according to claim 10, wherein the VGA further comprises one or more additional transistor sets in parallel with the first and second transistor sets; wherein each additional transistor set is reconfigurable between the on and off positions for adjusting the overall base resistance and the overall base-collector capacitance; and wherein each of the first, second and additional transistor sets comprise different sizes.

12. The optical receiver according to claim 1, wherein the TIA further comprises:
a second feedback loop comprising:
a second input forming a differential input with the first input;
a third transistor forming a differential pair with the first transistor;
a fourth transistor forming a differential pair with the second transistor, and in parallel with the third transistor;
each of the third and fourth transistors including third and fourth terminals, the third terminals connected in parallel and to the second input, and the fourth terminals connected in parallel and to a second output; and
a second feedback resistor between the first terminals and the second terminals;

wherein the second and fourth transistors are reconfigurable between on and off positions independent of the first and third transistors.

13. An optical receiver comprising:
a photodetector capable of generating a current in response to an optical signal;
a trans-impedance amplifier (TIA) capable of converting the current into a voltage; and
a variable gain amplifier (VGA) capable of amplifying the voltage to a desired output voltage;
wherein the VGA includes first and second transistor sets including input terminals in parallel and output terminals in parallel; and
wherein the second transistor set is reconfigurable between an on position and an off position independent of the first transistor set for adjusting overall base resistance and overall base-collector capacitance.

14. The optical receiver according to claim 13, further comprising:
a gain control circuit for transmitting a reconfigurable control signal to the second transistor set for reconfiguring the second transistor set between the on position and the off position.

15. The optical receiver according to claim 14, wherein the gain control circuit is also capable of transmitting VGA gain control signals to the first and second transistor sets for adjusting gain therein.

16. The optical receiver according to claim 13, wherein the TIA includes a first transistor and a second transistor, each including transistor input terminals and transistor output terminals in parallel; and wherein the second transistor is reconfigurable between on and off positions for adjusting the overall base resistance and the overall base-collector capacitance.

17. The optical receiver according to claim 13, further comprising a gain control circuit capable of transmitting a TIA gain control signal to the TIA for adjusting gain.

18. The optical receiver according to claim 17, wherein the TIA includes a variable feedback resistor controllable by the TIA gain control signal for adjusting the gain.

19. The optical receiver according to claim 13, further comprising one or more additional transistor sets with additional input terminals and additional output terminals in parallel with the input terminals and the output terminals, respectively, of the first and second transistor sets; wherein each additional transistor set is reconfigurable between on and off positions for adjusting the overall base resistance and the overall base-collector capacitance.

20. The optical receiver according to claim 19, wherein each of the first, second and additional transistor sets comprise different sizes.

* * * * *